United States Patent
Sonsky et al.

(10) Patent No.: US 7,923,345 B2
(45) Date of Patent: Apr. 12, 2011

(54) METHODS RELATING TO TRENCH-BASED SUPPORT STRUCTURES FOR SEMICONDUCTOR DEVICES

(75) Inventors: Jan Sonsky, Leuven (BE); Wibo D. Van Noort, Wappingers Falls, NY (US)

(73) Assignee: NXP B.V., Eindhoven (NL)

( * ) Notice: Subject to any disclaimer, the term of this patent is extended or adjusted under 35 U.S.C. 154(b) by 31 days.

(21) Appl. No.: 12/158,988

(22) PCT Filed: Dec. 18, 2006

(86) PCT No.: PCT/IB2006/054928
§ 371 (c)(1), (2), (4) Date: Aug. 12, 2008

(87) PCT Pub. No.: WO2007/072406
PCT Pub. Date: Jun. 28, 2007

(65) Prior Publication Data
US 2009/0227091 A1    Sep. 10, 2009

(30) Foreign Application Priority Data

Dec. 22, 2005   (EP) .................................... 05112835

(51) Int. Cl.
*H01L 21/76* (2006.01)
*H01L 21/302* (2006.01)
*H01L 21/461* (2006.01)

(52) U.S. Cl. ......... 438/411; 438/405; 438/412; 438/740

(58) Field of Classification Search .................. 438/411, 438/405
See application file for complete search history.

(56) References Cited

U.S. PATENT DOCUMENTS

| 6,887,391 | B1 * | 5/2005 | Daneman et al. ................. 216/2 |
| 6,930,027 | B2 * | 8/2005 | Parthasarathy et al. ........ 438/524 |
| 2004/0171233 | A1 * | 9/2004 | Ohmi et al. .................... 438/458 |
| 2005/0020085 | A1 * | 1/2005 | Lee et al. ...................... 438/700 |
| 2006/0022269 | A1 * | 2/2006 | Kato ............................. 257/347 |

FOREIGN PATENT DOCUMENTS

| DE | 3715232 A1 | 11/1988 |
| WO | 0002235 A1 | 1/2000 |
| WO | 2005093824 A1 | 10/2005 |

OTHER PUBLICATIONS

WIPO Publication No. WO 2006/109265 A1 to Sonsky.*

* cited by examiner

*Primary Examiner* — N Drew Richards
*Assistant Examiner* — Michael Jung

(57) ABSTRACT

A method of manufacturing a semiconductor device wherein a laminate structure comprising a sacrificial layer is sandwiched between two etch stop layers (8,11) and which separates a semiconductor membrane (9) from a bulk substrate (1) is used to provide an underetched structure. Access trenches (4) and support trenches (5) are formed in the layered structure through the thickness of the semiconductor layer (9) and through the upper etch stop layer (8). The support trenches extend deeper through the sacrificial layer (12) and the lower etch stop layer and are filled. The sacrificial layer is exposed and etched away selectively to the etch stop layers to form a cavity (30) and realise a semiconductor membrane which is attached to the bulk substrate via a vertical support structure comprising the filled support trenches.

11 Claims, 11 Drawing Sheets

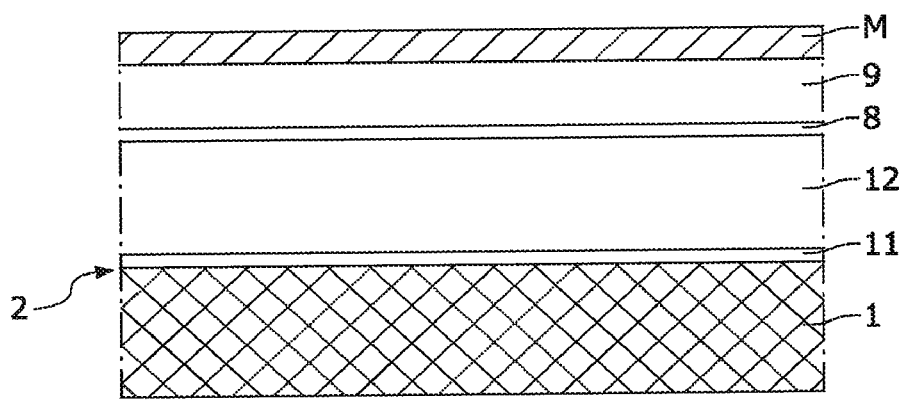
FIG. 1A  PRIOR ART
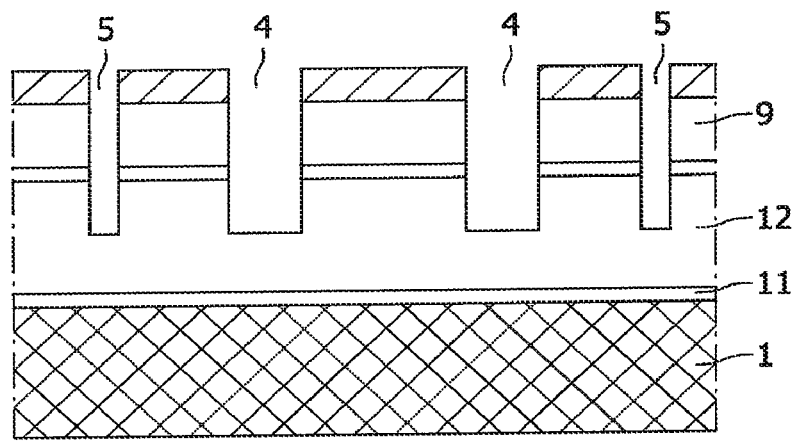
FIG. 1B (i)  PRIOR ART
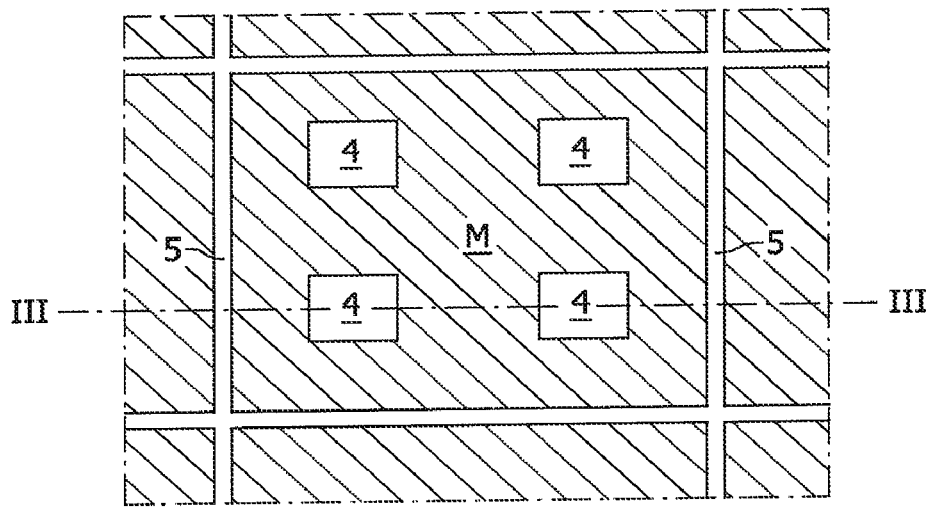
FIG. 1B (ii)  PRIOR ART

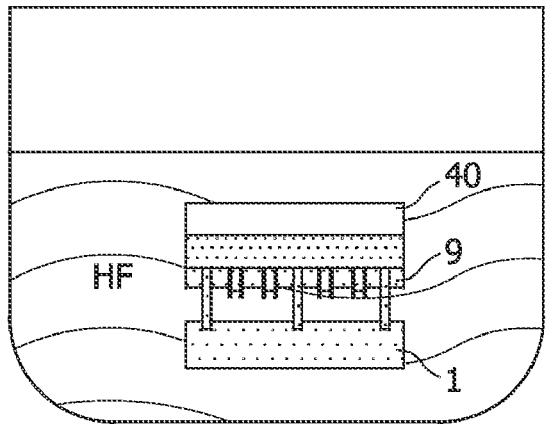
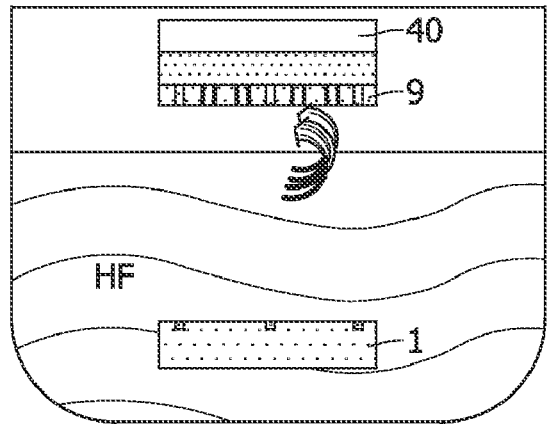
FIG. 4A  FIG. 4B
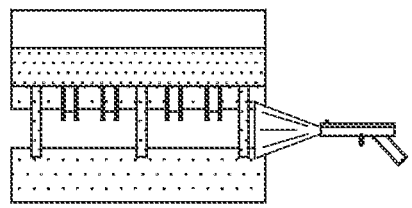
FIG. 5A
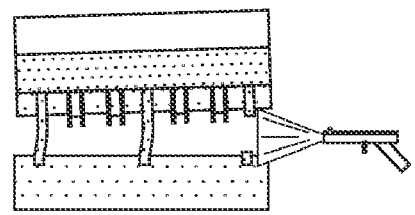
FIG. 5B
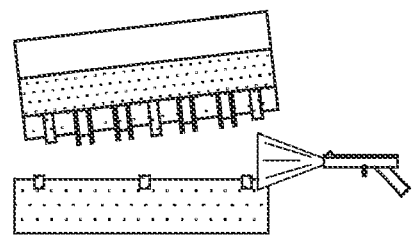
FIG. 5C

METHODS RELATING TO TRENCH-BASED SUPPORT STRUCTURES FOR SEMICONDUCTOR DEVICES

The invention relates to a method of manufacturing a semiconductor device comprising forming a layered structure comprising a semiconductor layer on an upper etch stop layer on a sacrificial layer on a lower etch stop layer on a substrate, forming a first and a second set of trenches through the semiconductor layer and through the upper etch stop layer, and through the first set of trenches etching the sacrificial layer selectively to the upper etch stop layer and the lower etch stop layer to provide a supported portion of the semiconductor layer over a cavity. In particular, but not exclusively, the invention relates to the transfer of a semiconductor membrane from the substrate on which it is processed.

Modern semiconductor device technology demands increasingly thin semiconductor bodies on which devices of various types can be processed. This demand on decreased thickness is driven by the device parameter requirements which dictate faster, smaller and more reliable final products. Thin semiconductor membranes can be realised by adopting silicon-on-insulator (SOI) or, preferably, silicon-on-nothing (SON) technology wherein the membranes are supported on an insulator or cavity respectively, whilst the device processing takes place. Once the front-end-of-line and back-end-of-line processing is complete the devices are transferred to a wafer for use in the final product.

WO-2005/093824 discloses an example method of manufacturing a semiconductor device wherein a semiconductor body is supported by a carrier substrate over an insulator or cavity, and reference thereto is invited. An underetch technique is employed to remove a sacrificial layer which is between the semiconductor body and the substrate. An outline of the process disclosed by WO-2005/093824 will now be given with reference to FIGS. 1A to 1D. Reference numerals used in the figures of WO-2005/093824 will be used here as far as is possible.

A layered structure is formed by starting with a semiconductor body 2 which comprises a substrate 1. An epitaxial layer 11 of SiGe is grown on the substrate 1. A layer of silicon 12 is grown thereon. Another layer of SiGe 8 is grown on the silicon layer 12. A layer of silicon 9 is grown on the second SiGe layer 8. A hard masking layer M is deposited over the layer structure. The hard mask M is patterned using photolithography. Two sets of recesses, or trenches, are formed through the silicon layer 9 and through the second SiGe layer 8. As shown in sectional view in FIG. 1B(i), a first set of trenches 4 and a second set of trenches 5 are formed. The plan view shown in FIG. 1B(ii) shows the layout of these trenches from above the layered structure. The sectional views of FIG. 1 are taken through line III-III of FIG. 1B(ii).

It will be appreciated that the specific layout of trenches in FIG. 1 does not correspond entirely with that disclosed by WO-2005/093824. However, this should not distract from providing an outline of the method used. It can be seen that the second set of trenches 5 is shaped like a groove and has a width dimension which is smaller than that of the first trenches 4.

With reference to FIG. 1C, a dielectric layer 6 is deposited over the surface of the semiconductor body 2. The thickness of this layer 6 and the dimensions of the trenches 4 and 5 are chosen such that the first set of trenches 4 is provided only with a uniform coating by the layer 6, while the second set of trenches 5, or grooves, are completely filled by the dielectric layer 6.

A cavity 20 is then formed by performing an isotropic wet etch through the first set of trenches 4. The silicon layer 12 is etched selectively to the two SiGe layers 8, 11 which serve as an upper etch stop layer and a lower etch stop layer.

The disclosed method provides a semiconductor body 9 supported above a cavity 20. The cavity may subsequently be oxidised to form an SOI type of device. The support for the suspended semiconductor body 9 is provided horizontally by the dielectric-filled trenches 5 together with the remaining silicon material 12. This horizontal support limits the extent to which the underetching can be carried out. If the lateral dimensions of the suspended area of silicon were to be increased, then the probability of failure of the structure would be increased. Therefore, the method is limited to providing relatively small areas of SOI or SON compared to the area of the entire wafer.

According to the present invention there is provided a method of manufacturing a semiconductor device comprising the steps of:
  forming a layered structure comprising a semiconductor layer on an upper etch stop layer on a sacrificial layer on a lower etch stop layer on a substrate;
  forming a first set of trenches through the semiconductor layer and through the upper etch stop layer;
  forming a second set of trenches through the semiconductor layer, the upper etch stop layer, the sacrificial layer and the lower etch stop layer
  filling the second set of trenches to provide a support structure between the semiconductor layer and the substrate;
  through the first set of trenches etching the sacrificial layer selectively to the upper etch stop layer and the lower etch stop layer.

By providing a vertical support structure between the semiconductor layer and the substrate a larger area of the semiconductor layer can be underetched. This benefit can be extended to realise a full wafer semiconductor membrane to be attached to a bulk substrate bringing a large number of associated advantages and applications as will be discussed further on in the application. Furthermore, the vertical support structure provided by the invention gives increased mechanical stability compared to the product of the above-described method.

In preferred embodiments of the invention, the second set of trenches is initially formed during the same process step as forming the first set of trenches, both sets being formed through the semiconductor layer and through the upper etch stop layer, the method further comprising the steps of:
  depositing a barrier material at the base of the first set of trenches to cover the exposed surface of the sacrificial layer before etching through the base of the second set of trenches, the sacrificial layer and the lower etch stop layer; and,
  etching away at least a portion of the barrier material to expose the sacrificial layer before said step of selectively etching the sacrificial layer. By forming the first and second set of trenches in the same process step, advantageously only one mask set is required.

In this case, one of the first and second set of trenches is preferably wider than the other, and the method further comprises the step of depositing a layer over the semiconductor layer after the trenches have been formed, the deposited layer having a thickness which fills the narrower set of trenches but does not fill the wide set of trenches. Advantageously, this minimises the number of mask sets by exploiting the difference in trench sizes to fill one set and not the other.

In a first preferred embodiment, the second set of trenches is wider than the first set, and the deposited layer serves as the deposited barrier material at the base of the first set of trenches to cover the exposed surface of the sacrificial layer. Advantageously, the trenches which provide the access to the sacrificial layer are narrower than those which correspond to the support structure. There are typically more trenches required for the first set than the second set and so this embodiment provides a reduction in the area of the silicon layer used by the trenches, i.e. unusable for device fabrication.

In a second preferred embodiment, the first set of trenches is wider than the second set and wherein the step of depositing a barrier material at the base of the first set of trenches involves oxidising the bases thereof, and the method further comprises the step of removing the deposited layer material from the second set of trenches before the step of etching through the base thereof. The step of oxidation is simple and serves to provide the barrier material at the base of the first set of trenches whilst the second set are etched deeper.

Preferably, the method further comprises filling the first set of trenches with an insulating material after the sacrificial layer is etched away so as to provide a semiconductor-on-nothing structure. Processing of the semiconductor devices and/or circuitry on the supported semiconductor layer can then be carried out.

One significant advantage provided by the wafer-scale vertical support structure is that the semiconductor layer, or membrane, can be simply detached from the substrate by merely breaking the vertical links. This can be done by simply bathing the semiconductor layer and substrate in an etch solution or, alternatively, by applying a pressurised water or air flow thereto.

Another significant benefit provided by the invention is that the supported membrane can be simply divided into a plurality of separate chips whilst still attached to the bulk substrate. This can be carried out by depositing a mask layer over the processed semiconductor layer, patterning the mask layer to expose selected parts of the semiconductor layer surface, dry etching through the exposed parts to divide the processed semiconductor layer into a plurality of discreet islands, each being supported by respective parts of the support structure, all before the step of detaching the semiconductor layer. Furthermore, the enabling of standard etching to be exploited to divide the membrane provides a reduction in the width of the sawlanes (or sawing lanes) used. For example, the parts left exposed by the mask layer may have a dimension of less than 1 μm.

A further significant advantage provided by the invention is that the substrate can be re-used a number of times to repeat the method after the semiconductor layer is detached, thus greatly reducing the substrate costs of the overall process.

Instead of forming a SON type of structure the cavity provided by the removed sacrificial layer can be filled with an insulating layer to provided a SOI structure.

Embodiments of the invention will now be described, by way of example only, with reference to the following drawings in which:

FIGS. 1A to 1D show a known method of manufacturing a semiconductor device;

FIG. 4 shows an example method of detaching the semiconductor layer from the substrate;

FIG. 5 shows another example method of detaching the semiconductor layer from the substrate;

It will be appreciated that the Figures are merely schematic. The same reference numerals are used throughout the Figures to denote the same or similar parts.

Figure 1C:
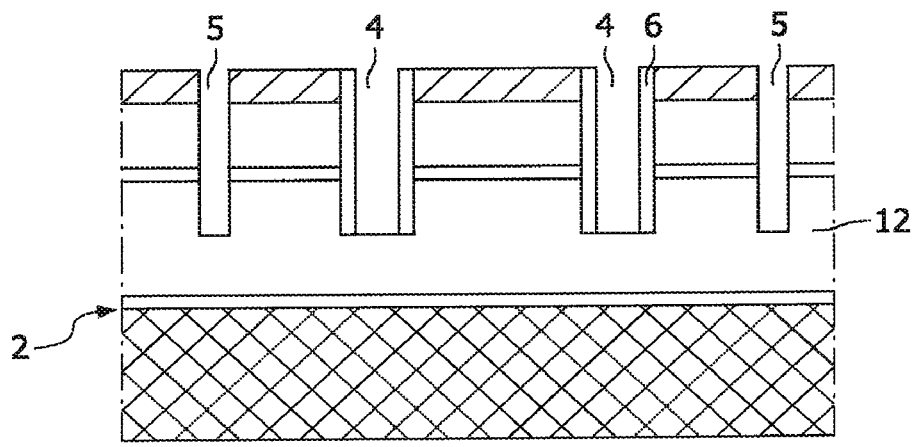
Figure 1D:
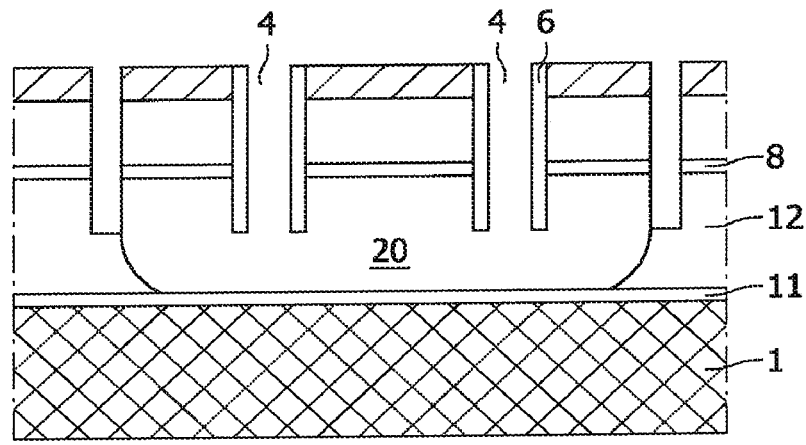

A first embodiment of the invention shares some of the initial process steps of WO-2005/093824 and, therefore, will be described with reference initially to FIGS. 1A, 1B and 1C. The method of the invention exploits the selective etch of a sacrificial layer disposed between the semiconductor membrane and the bulk substrate as employed in the method disclosed by WO-2005/093824. As shown in FIG. 1A, a layered, or laminate, structure is formed comprising a semiconductor layer 9 on an upper etch stop layer 8 on a sacrificial layer 12 on a lower etch stop layer 11 on a substrate 1. The bulk substrate 1 in this example is a semiconductor substrate of silicon. On this substrate, an epitaxial layer of SiGe 11 is grown to a thickness in the range of 1 to 50 nm and serves as a lower etch stop layer. The germanium content of this layer 11 ranges between 10 and 30 at. %. An epitaxial layer of silicon 12 is then grown on the lower etch stop layer 11 to a thickness of between 20 and 1000 nm. The layer of silicon 12 serves as the sacrificial layer which will be subsequently etched away selectively to the etch stop layers. The upper etch stop layer 8 is then formed by growing a second layer of SiGe on the sacrificial silicon layer 12.

The semiconductor layer is then formed by depositing a layer of silicon on the upper etch stop layer, the silicon layer 9 having a thickness of approximately 2 μm. A hard mask layer M, of silicon nitride for example, is then deposited on the layered structure 2. This may comprise a single layer, say, of silicon nitride for example, or a combination of dielectric layers such as an oxide-nitride-oxide layer.

With reference to FIG. 1B, the hard mask M is subsequently patterned using photolithography and etching, the etched portions corresponding to the desired positions of the trench formation. First and a second sets of trenches 4,5 are then formed by etching through the semiconductor layer 9 and through the upper etch stop layer 8.

It should be appreciated that the term 'trench' is well known in the art and will be taken to include the recess which results from an anisotropic etch through the mask M. The term trench can include a recess, hole or groove wherein the plan sectional shape may be, for example, circular, rectangular or elongate. The plan sectional shape of each trench may, or may not, be substantially regular with substantially vertical sidewalls throughout the depth thereof. FIG. 1B shows the first set of trenches 4 having a rectangular plan sectional area which is regular through its depth.

The second set of trenches 5 are elongate in shape and form a grid of trenches across the semiconductor layer 9, as shown in part in FIG. 1B(ii). The grid extends across the area of the layered structure and, in this particular embodiment, the width of the trenches lays in the range of 100-300 nm. For the remainder of the description, the second set of trenches may be referred to as support trenches.

The trenches of the first set 4 each have a rectangular plan section and are located in a regular repeating pattern across the layered structure spaced between the grid formed by the support trenches 5. The width of these trenches lays in the range of 200-600 nm (approximately two times wider than the support trenches). For the remainder of the description, the first set of trenches may be referred to as access trenches.

It can be seen from FIG. 1B that the access trenches are wider than the support trenches. A dielectric layer 6 is deposited over the layered structure. The dielectric layer 6 is typically composed of a thin oxide layer and a thicker nitride layer, the main purpose of the thin oxide layer being to cover the sidewalls of the nitride layer in the hard mask M. Due to the difference in widths of the trenches, and the chosen thickness of the dielectric layer 6, the narrower support trenches 5 are completely filled whilst in the wider access trenches 4 the sidewalls are merely lined by the dielectric. A spacer etch (anisotropic etch) is carried out to remove the dielectric layer material 6 at the bases of the access trenches 4 and from the surface of the hard mask M as shown in FIG. 1C.

Figure 2A:
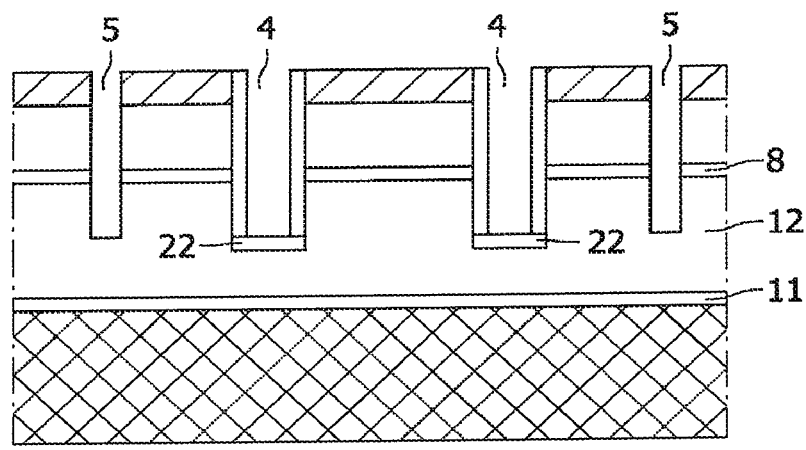
FIGS. 2A to 2G show sectional views through part of the layered structure at various steps in the method in accordance with a first embodiment of the invention.
Figure 2B:
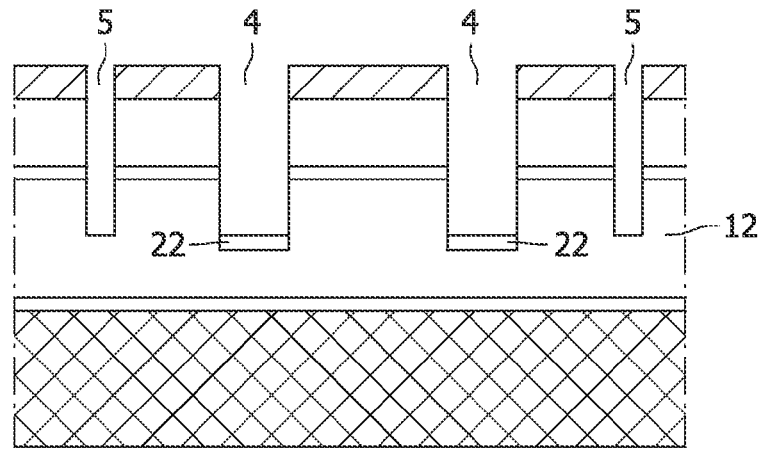

With reference to FIG. 2A, an oxidation step is then carried out to oxidise a region at the base of each access trench. These oxidised regions 22 serve as barriers at the base of the access trenches to cover the exposed surface of the sacrificial layer 12. The dielectric material 6 is then removed from the trenches 4,5 using a nitride wet etch for example and as shown in FIG. 2B.

Figure 2C:
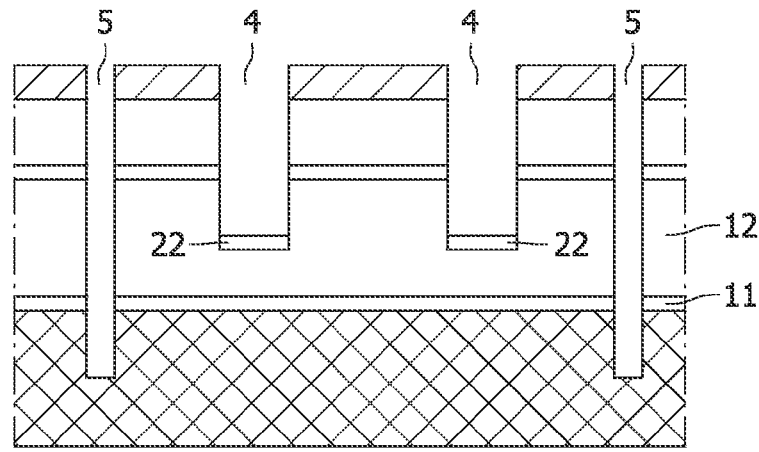

An anisotropic etch is then executed to etch through the bases of the second set of trenches 5, the sacrificial layer 12 and the lower etch stop layer 11 (FIG. 2C). The oxide regions 22 at the base of the access trenches 4 prevents any etching thereof.

Figure 2D:
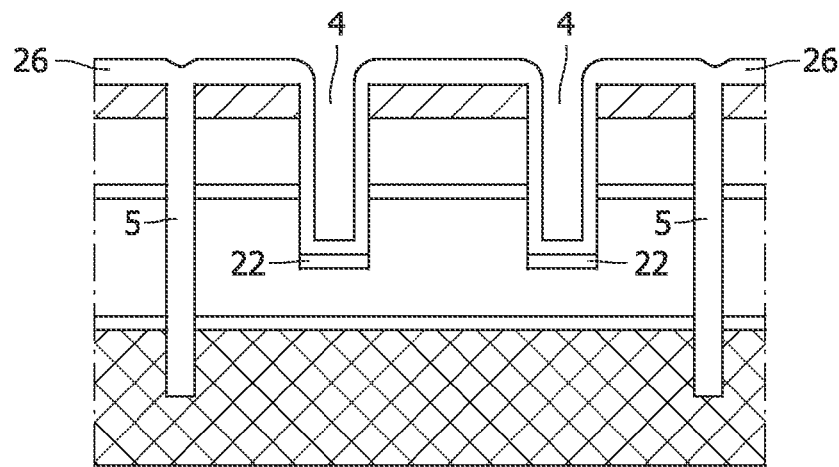
Figure 2E:
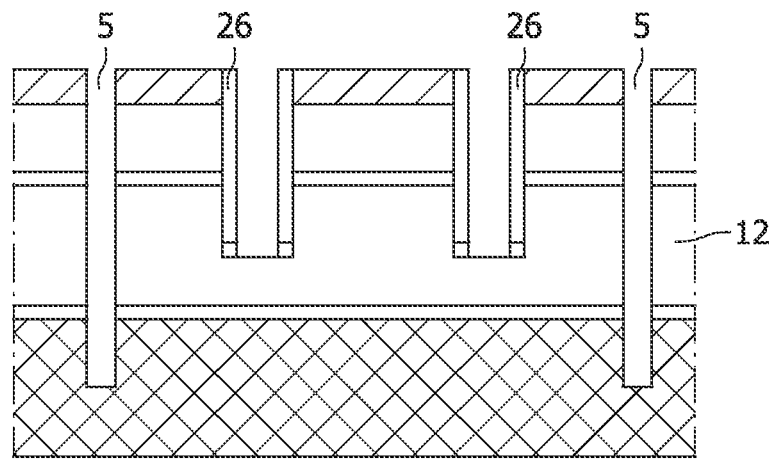

A dielectric layer, of silicon oxide for example, is then deposited over the semiconductor layer. Again, as shown in FIG. 2D, the thickness of the dielectric is chosen so that it fills the support trenches 5 but just lines the walls of the access trenches 4. An anisotropic etch is then carried out to expose the surface of the sacrificial layer 12 and to remove the dielectric from the top surface of the hard mask M (FIG. 2E).

Figure 2F:
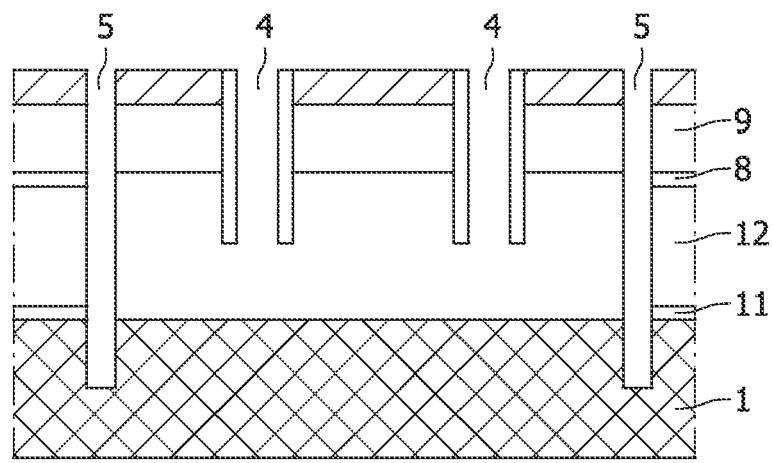

In a similar manner to the process disclosed by WO-2005/093824, the sacrificial silicon layer 12 is etched selectively to the upper etch stop layer 8 and the lower etch stop layer 11 to the extent that it is substantially removed, thus leaving a cavity 30 under the silicon membrane 9. However, in accordance with the invention, the entire sacrificial layer can be removed across the entire wafer leaving the vertical support structure provided by the filled trenches 5 to support the silicon membrane 9 above the cavity 30. As shown in FIG. 2F, the upper and lower SiGe etch stop layers 8, 11 are also removed. It will be appreciated, however, that this is not essential.

The underetched silicon membrane 9 is attached to the underlying bulk silicon 1 by a vertical attachment. The mechanical stability provided by this wafer-scale attachment enables the membrane 9 to have semiconductor devices processed thereon. Furthermore, in the case of removal of the SiGe etch stop layers 8,11, there is greater freedom of choice for the processing temperatures.

Figure 2G:
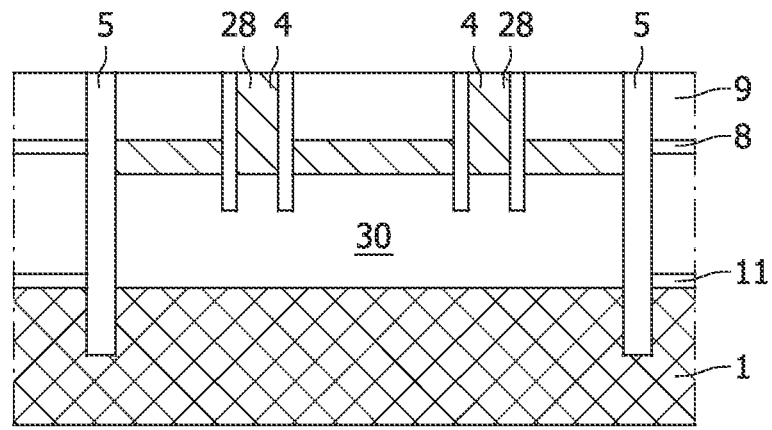

With reference to FIG. 2G, the access trenches 4 are filled with an insulating material 28 after the sacrificial layer 12 is etched away so as to provide a SON structure. In this case, the material 28 is an oxide which is deposited by a conformal oxide deposition method, e.g. TEOS or another low-pressure CVD method. An ideally conformal deposition results in the same amount of oxide being deposited on the surfaces of the access trench sidewalls, the underside of the membrane 9 and the topside of the wafer 1. This process dictates that the width of the access trenches 4 must be sufficiently less than the depth of the cavity 30, otherwise the cavity would become completely filled.

Alternatively, a non-conformal oxide deposition may be employed such as high density plasma CVD producing HDP oxide, or a plasma enhanced CVD method. In this case, no oxide will be deposited on the access trench sidewalls or the underside of the membrane 9. The oxide will be deposited only on the top of the initial wafer 1 in the access trench openings and on all upward-facing surfaces. Therefore, the access trenches are filled from the bottom upwards thus providing additional vertical links from the membrane 9 to the substrate 1 via the access trenches 4. Although this will leave most of the cavity 30 unfilled, it can, advantageously, improve the robustness of the membrane attachment to the initial substrate 1, albeit at the cost of having extra links to break during the final detachment step.

To achieve a balance between filling of the cavity 30 (conformal deposition) and creating extra links in the support structure (non-conformal deposition), a semi-conformal deposition layer can be formed so that the access trench sidewall deposition will result in closing the trenches before the cavity 30 is filled.

It should be appreciated that other insulating materials may be used to fill the access trenches 4 such as silicon nitride.

After the filling the access trenches 4, a planarization (e.g. CMP) step is carried out to provide the structure as shown in FIG. 2G.

Figure 3:
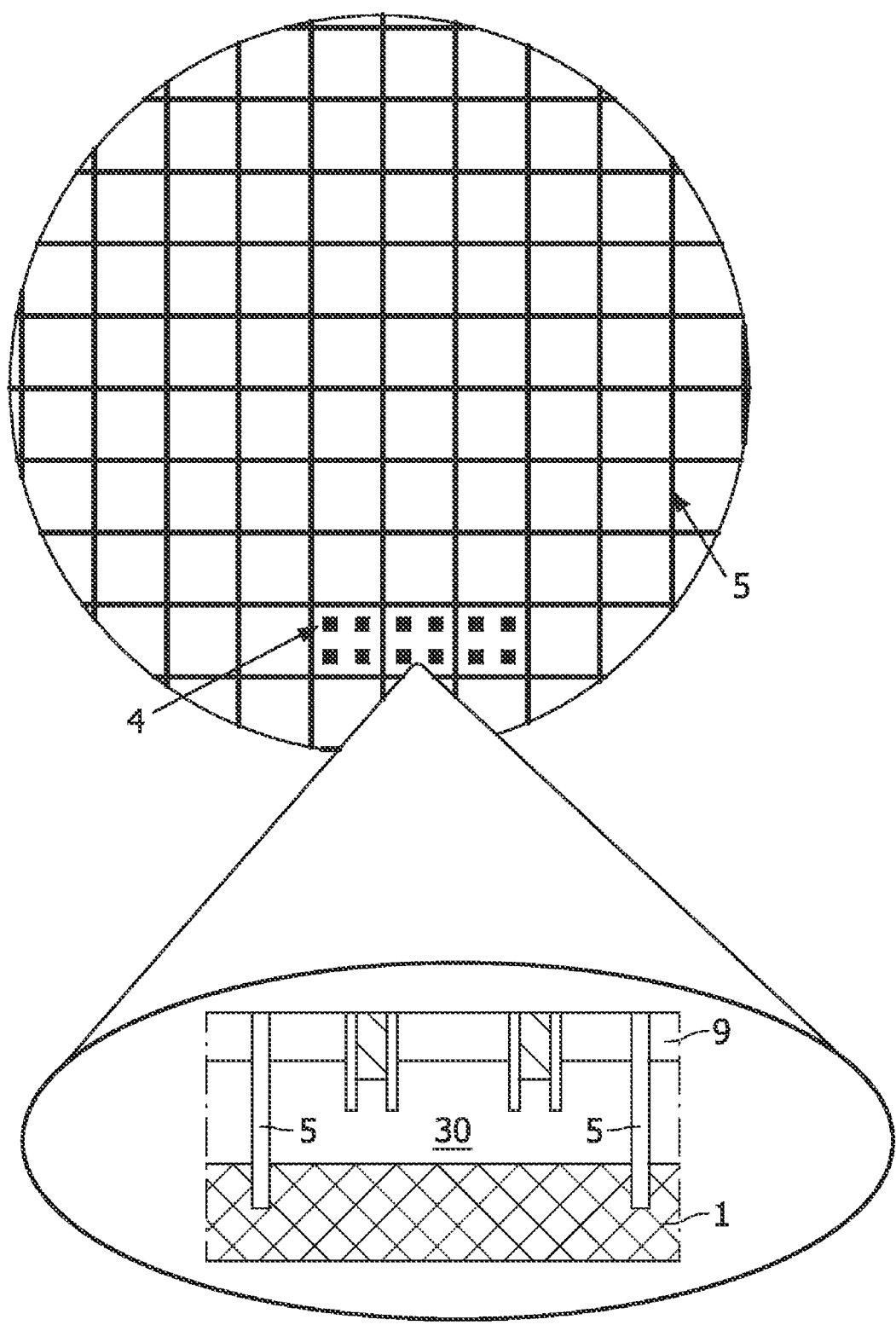
FIG. 3 shows the relationship between the part shown in FIG. 2 and the device as a whole.

To aid understanding of the relationship between the sectional figures shown and the wafer as a whole, FIG. 3 shows a plan view of part of the wafer together with an enlarged sectional view of one 'cell' of the grid created by the filled support trenches 5.

As shown in FIG. 3, the full wafer membrane 9 is attached to the bulk silicon 1 by an array of narrow (typically a few 100 nm wide) links made out of silicon oxide for example. In this state, the wafer can be processed so as to process semiconductor devices and/or circuitry on the supported semiconductor layer 9 with front-end-of-line and back-end-of-line processes. Once this is complete, a support substrate is attached to the backside of the silicon membrane. Advantageously, the semiconductor layer can be simply detached from the substrate by breaking the support structure.

One example method of breaking the support structure to release the processed silicon membrane 9 is shown in FIG. 4. The semiconductor layer 9 and substrate 1 are bathed in an HF etch solution (FIG. 4a). This serves to break the links of the support structure 5 allowing a separation of the processed device from the substrate 1 (FIG. 4b). The separated silicon membrane 9 is supported by the support substrate 40.

Another example method of breaking the support structure to release the processed silicon membrane 9 is shown in FIG. 5. In this case a stream from a pressurised water or air gun is employed to break the links.

Figure 6:
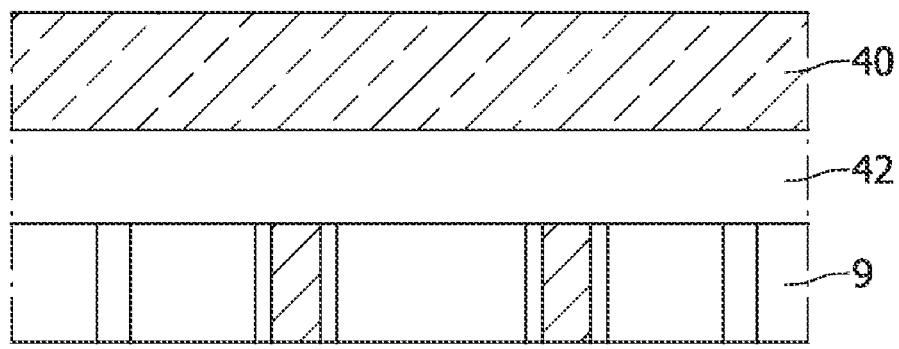
FIG. 6 is a sectional view through part of the structure of FIG. 2 showing the semiconductor layer and transfer substrate when separated from the support substrate.
Figure 6:
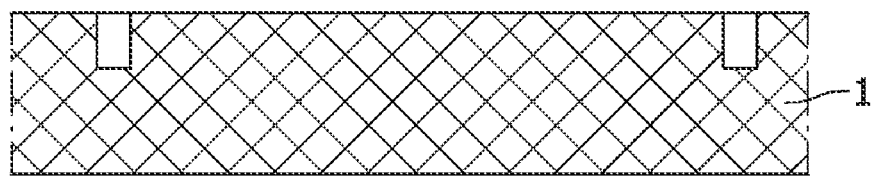

FIG. 6 shows the semiconductor layer 9 with the processed circuitry 42 thereon, supported by the support substrate 40 and detached from the substrate 1. Once the detachment is made, the original bulk substrate 1 can be polished and reused for a new process. Since the semiconductor membrane 9 was epitaxially grown on the substrate 1, the only loss of the substrate thickness is due to the polishing and thus the substrate 1 can be used numerous times for this process.

Figure 7A:
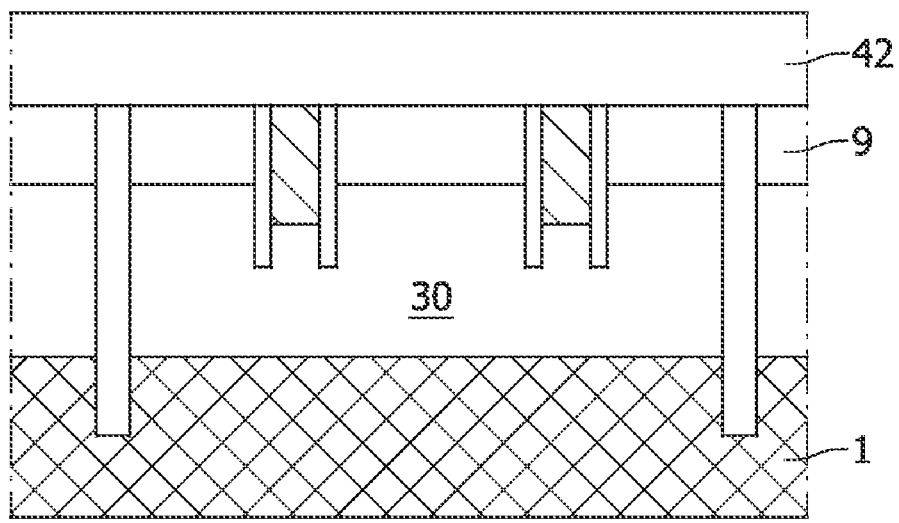
FIG. 7A to 7C show sectional views through part of the layered structure made in accordance with the first embodiment of the invention at various stages of separating the individual chips on the semiconductor layer; and, FIGS. 8A to 8F show sectional views through part of the layered structure at various steps in the method in accordance with a second embodiment of the invention.
Figure 7B:
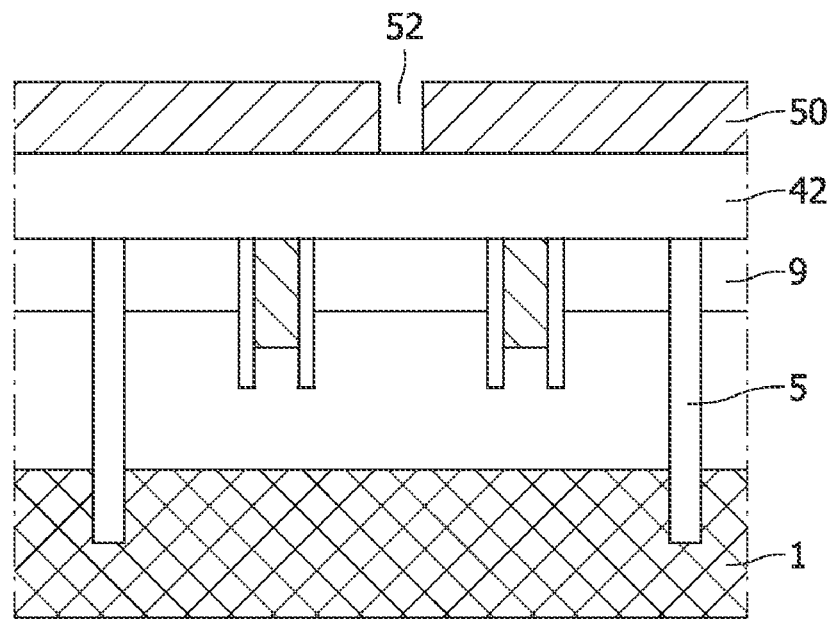

A further advantage provided by the resultant structure from the method of the invention is that standard dry etching can be exploited to divide the processed semiconductor membrane 9 whilst it is still attached to the substrate 1. FIG. 7A shows the underetched silicon membrane 9 with processed circuitry 42 thereon. A SAW mask 50 (or sawing mask, scribe lane mask or seal ring) is deposited and patterned over the backend 42 as shown in FIG. 7B. The mask layer 50 is patterned to expose selected parts of the semiconductor layer surface which correspond to where the division of the membrane 9 is required. Conversely, the regions covered by the SAW mask 50 define the individual chips on the semiconductor membrane 9.

Figure 7C:
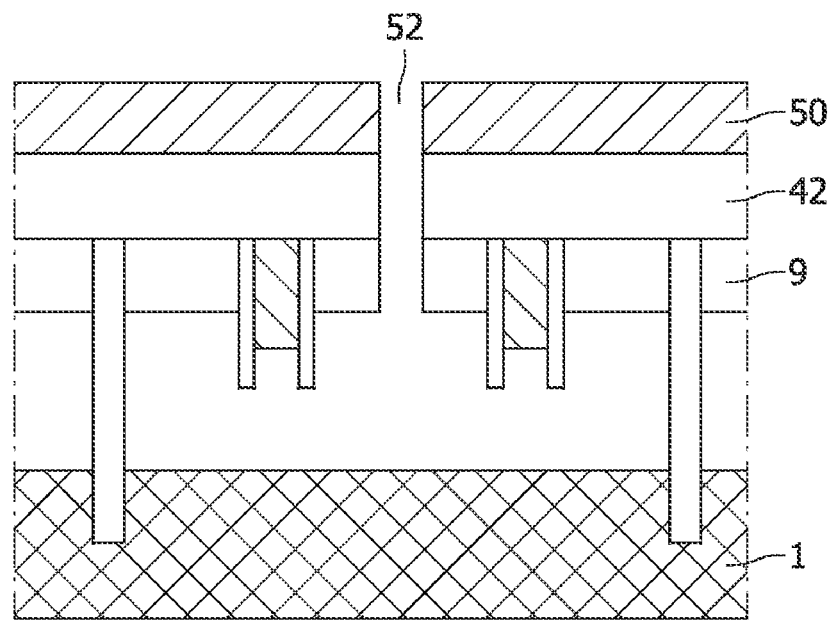

The layers to be etched comprise the backend layers 42, which typically include an oxide multistack with a maximum total thickness of several microns, and the silicon membrane which is less than 1 µm. This relatively thin stack allows a standard etch process to be employed. The saw lanes 52 have a dimension of less than 10 µm, and preferably less than 1 µm. This greatly reduces the semiconductor area lost compared to the conventional wide (≈70 µm) sawlanes. The dry etch is carried out (FIG. 7C) and the separated chips remain attached to the substrate.

It will be appreciated that the chips cannot be divided with a pitch less than that of the grid of support trenches 5.

Once the chips are separated from one another, the process of detachment from the supporting substrate 1 as described above can take place. However, it is envisaged also that the chips can be removed from the substrate 1 individually by a chip sorting machine for example. Such a machine can then simply grab the desired portion of silicon membrane 9 with the chip thereon with vacuum tweezers for example. The associated support structure is simply broken by pulling the chip away from the substrate 1 and the chip can then be placed directly into a chip package. In this way, a stack of multiple chips on top of one other can be made. The method in accordance with the invention allows for the chips to be fabricated on a very thin semiconductor membrane which can result in a very thin chip stack. This is particularly attractive to applications where miniaturisation is critical such as mobile phones.

Figure 8A:
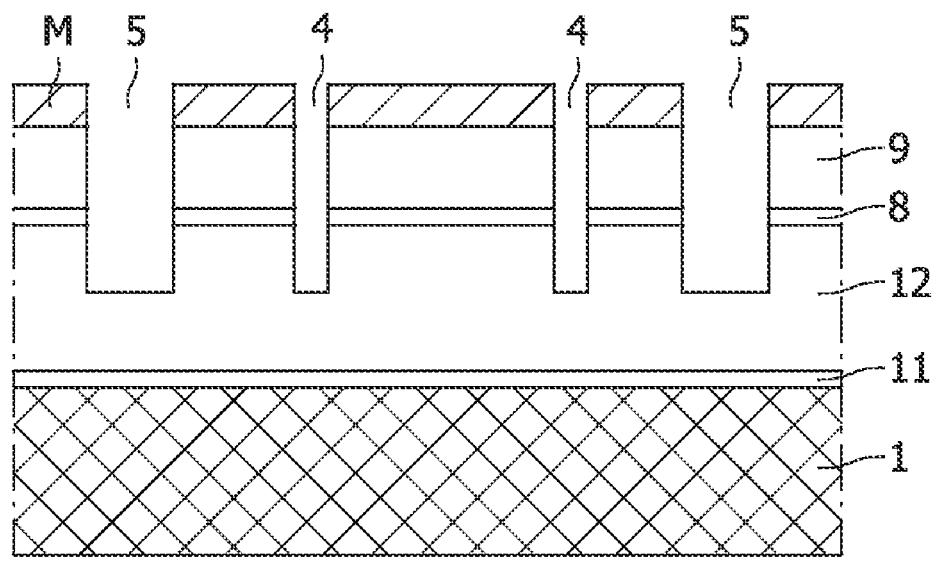

A second embodiment of the invention will now be described with reference to FIGS. 8A to 8F. In the first embodiment the access trenches 4 were made wider than the support trenches 5. This difference in trench widths enables a single dielectric deposition of a chosen thickness to be used to fill one set of trenches and not the other. In the second embodiment the support trenches 5 are wider than the access trenches 4. The initial process steps up to and including the step of depositing the hard mask M (FIG. 1A) in the first embodiment are the same for the second embodiment and will not be described further. With reference now to FIG. 8A, the hard mask M is patterned and an etch is carried out to form two sets of trenches; a relatively narrow set of access trenches 4, i.e. having a width in the range of 100-300 nm, positioned in a spaced relationship in between a grid of relatively wide support trenches 5 having a width in the range of 200-600 nm.

Figure 8B:
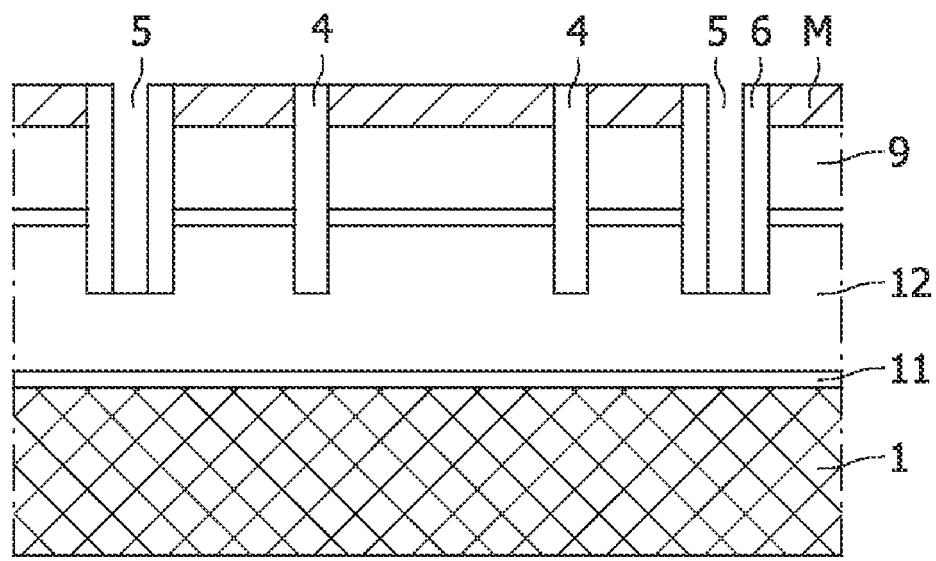

In a similar manner to the first embodiment, a dielectric layer 6 of a chosen thickness is deposited over the array of trenches. A spacer (anisotropic) etch of the dielectric layer 6 follows to open the base of support trenches. In this case, however, the dielectric fills the access trenches 4 and serves as the deposited barrier material at the bases thereof to cover the exposed surface of the sacrificial layer 12, as shown in FIG. 8B. Therefore, advantageously, there is no need to form an oxide barrier layer 22 at the base of the access trenches 4 in a separate step. The dielectric layer 6 does not fill, but merely covers the sidewalls of the support trenches 5.

Figure 8C:
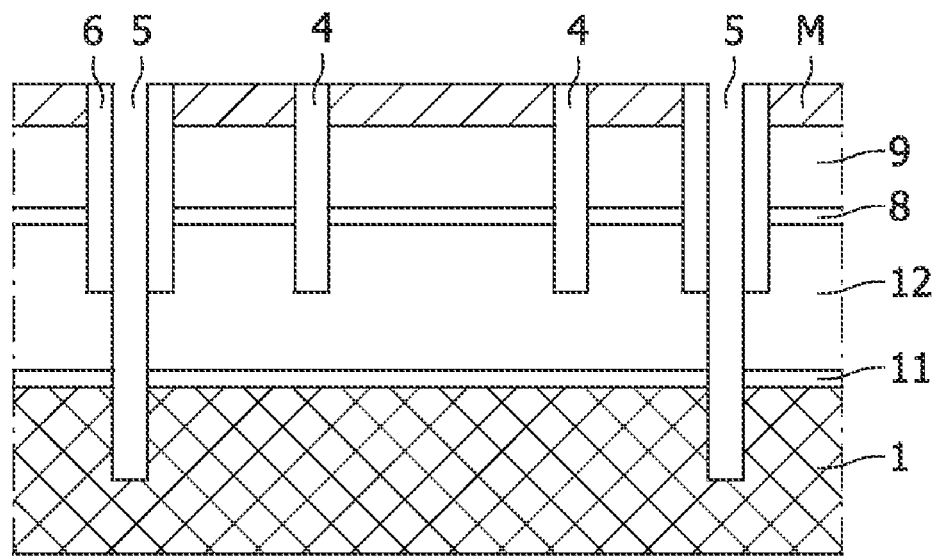
Figure 8D:
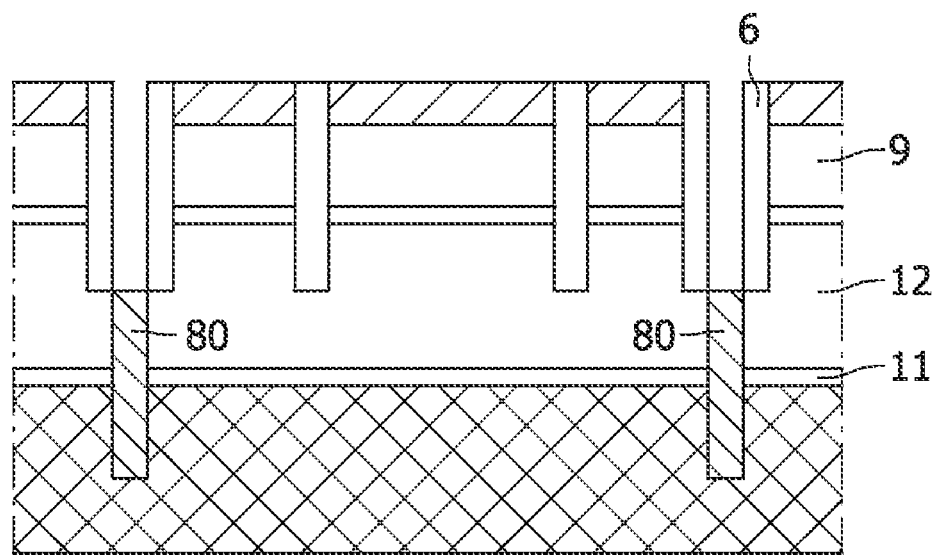

With reference to FIG. 8C, an anisotropic etch is then carried out to etch through the base of the support trenches 5, the sacrificial layer 12 and the lower etch stop layer 11, thus deepening the support trenches 5. The base of the support trenches 5 are then oxidised so as to provide at least part of the support structure 80 between the substrate 1 and the silicon membrane 9 (FIG. 8D). The nitride part of the dielectric spacers 6 is then removed from the support trenches 5, leaving the thin oxide component. The remaining portions of the support trenches 5 are then filled with, say, a dielectric such as silicon oxide. Then a planarization process (CMP) or simple anisotropic dry etch is carried out to remove such excess material from the top surface of the membrane 9 and to planarize it.

Figure 8E:
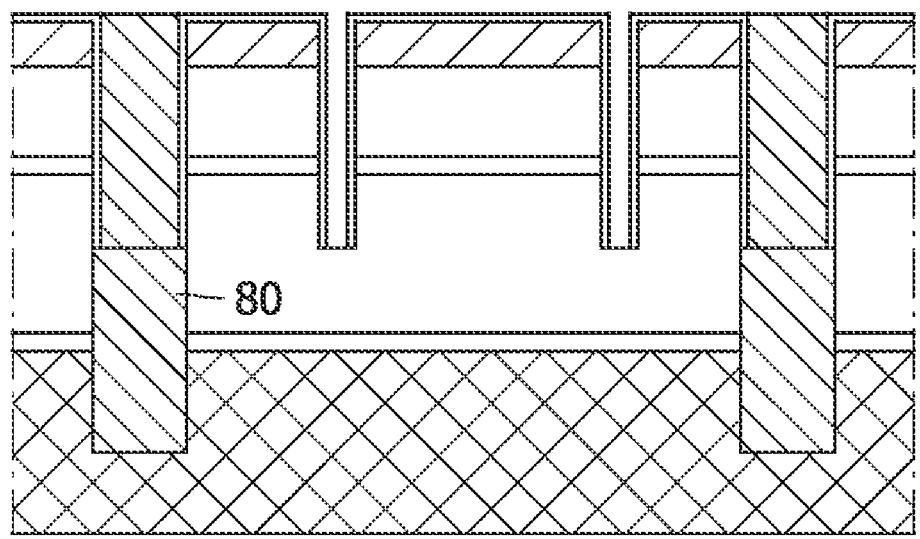

A wet nitride etch is then executed to remove the nitride from the access trenches 4, as shown in FIG. 8E.

Variations to this method of filling the support trenches 5 and accessing the sacrificial layer 12 through the access trenches 4 should be apparent to the skilled person. For example, the support trenches may be filled in a single step or portion-by-portion, with or without removing the spacers 6.

Figure 8F:
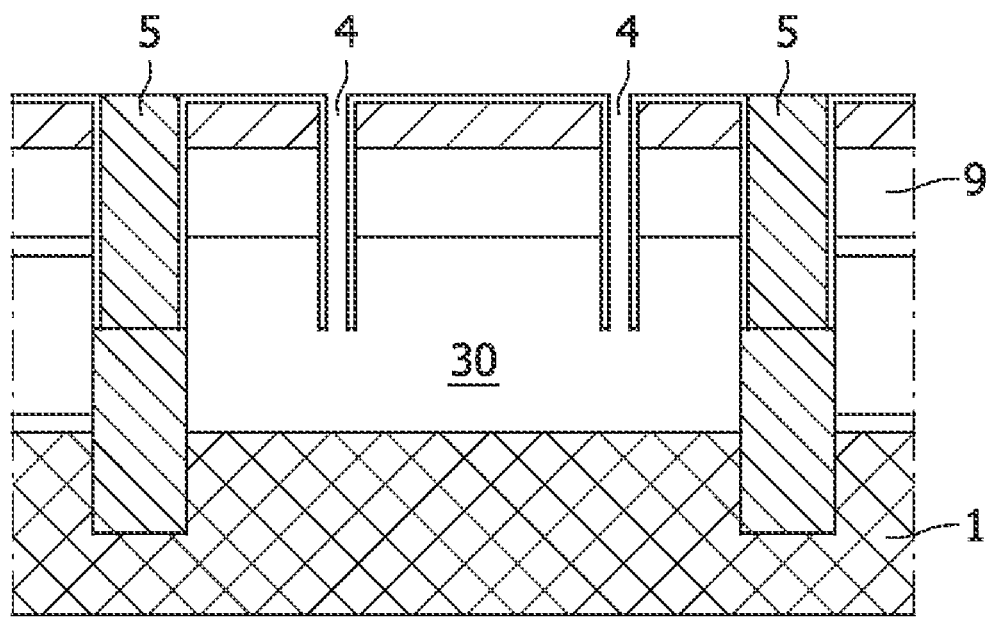

An isotropic etch is then carried out to remove the sacrificial layer 12 through the access trenches 5 selectively to the SiGe etch stop layers 8, 11 to form an cavity 30 under the supported membrane 9. The etch stop layers are then also removed as shown in FIG. 8F. An oxidation step can then be carried out to fill both the access trenches 4 and the support trenches 5 (not shown), in a similar manner to the first-described embodiment.

From reading the present disclosure, other variations and modifications will be apparent to persons skilled in the art. Such variations and modifications may involve equivalent and other features which are already known in the design, manufacture and use of semiconductors and which may be used in addition to or instead of features described herein.

For example, the two embodiments described have exploited the advantage of having access trenches and support trenches of different dimensions in that a single dielectric deposition can fill, and therefore provide a barrier in, the narrower trenches, thus saving extra process steps. However, it is envisaged that the method can be implemented with the support trenches and the access trenches being of a similar, or substantially the same, widths whilst still remaining within the scope of the invention and thus reaping the advantages thereof.

The embodiments described form the access trenches and support trenches in the same step as is favoured in view of the reduced number of photolithographic steps. However, it should be appreciated that the access trenches and support trenches may instead be formed in separate process steps wherein, typically, the support trenches are provided to the full depth in a single etch whilst remaining within the scope of the present invention. Also, it will be appreciated that the second set of trenches (support) may be formed before the first set of trenches (access).

It should be appreciated that materials other than silicon for the semiconductor membrane 9 and SiGe for the etch stop layers can be used. However, in order to allow defect-free epitaxial deposition of the sacrificial layer 12 and the top device layer, the etch stop layers are preferably of a sufficiently similar material, in terms of crystallography and lattice constant, to the sacrificial layer and semiconductor membrane. At the same time, the material of the etch stop layers should be sufficiently different from the sacrificial layer so that selective etching is possible. One option is to employ SiGe for the sacrificial layer and the semiconductor membrane whilst using silicon for the etch stop layers. In this case, the original substrate can be either SiGe or Silicon with a thick SiGe buffer layer grown first to accommodate the stresses (similar to that used for stress enhanced CMOS). Alternatively, a SiC layer (with only small amount of carbon) can be used as an etch-stopping layer.

In the above-described embodiments, the support trenches 5 have been filled with a dielectric, which thus form the support structure. However, it is envisaged that various materials can be employed and these will be apparent to the skilled person. The chosen material may determine, or be determined by, the method used to break the support structure in order to detach the membrane. For example if an oxide layer is used then an HF solution for a wet etch may be used, while hot-phosphoric-acid could be used in case of a nitride support structure.

Furthermore, the embodiments described result in a SON arrangement. It is envisaged, however, that the cavity 30 can be subsequently filled with an insulating material, such as silicon oxide, to provide a SOI arrangement. It will be appreciated that the advantages associated with the easy separation of the membrane from the bulk substrate are not applicable to this situation.

Alternative support trench layouts will be apparent to those skilled in the art beyond the grid arrangement disclosed in the appended drawings. For example, hexagonal shapes for the support trench network may instead be adopted.

Also, variations in the layout of the access trenches are possible whilst remaining within the scope of the invention. For example, unequal spacing of the access trench holes in different directions may be desired in the case wherein wet etching is used as an isotropic etch to remove the sacrificial layer. Such an etch can be preferential in some crystallographic directions and thus smaller spacing in those directions where etching proceeds slower may be advantageous.

In summary, there is provided a method of manufacturing a semiconductor device wherein a laminate structure comprising a sacrificial layer is sandwiched between two etch stop layers and which separates a semiconductor membrane from a bulk substrate is used to provide an underetched structure. Access trenches and support trenches are formed in the layered structure through the thickness of the semiconductor layer and through the upper etch stop layer. The support trenches extend deeper through the sacrificial layer and the lower etch stop layer and are filled. The sacrificial layer is exposed and etched away selectively to the etch stop layers to form a cavity and realise a semiconductor membrane which is attached to the bulk substrate via a vertical support structure comprising the filled support trenches.

What is claimed is:

1. A method of manufacturing a semiconductor device comprising the steps of:
    forming a layered structure comprising a semiconductor layer on an upper etch stop layer on a sacrificial layer on a lower etch stop layer on a substrate;
    forming a first set of trenches through the semiconductor layer and through the upper etch stop layer;
    forming a second set of trenches through the semiconductor layer, the upper etch stop layer, the sacrificial layer and the lower etch stop layer;
    filling the second set of trenches to provide a support structure between the semiconductor layer and the substrate; and
    through the first set of trenches, etching the sacrificial layer selectively to the upper etch stop layer and the lower etch stop layer; and
    wherein the second set of trenches is initially formed during the same process step as forming the first set of trenches, both sets being formed through the semiconductor layer and through the upper etch stop layer, the method further comprising the steps of:
    depositing a barrier material at a base of the first set of trenches to cover an exposed surface of the sacrificial layer before etching through the base of the second set of trenches, the sacrificial layer and the lower etch stop layer; and,
    etching away at least a portion of the barrier material to expose the sacrificial layer before said step of selectively etching the sacrificial layer.

2. A method according to claim 1, wherein one of the first and second set of trenches is wider than the other, and wherein the method further comprises the step of:
    depositing a layer over the semiconductor layer after the first and second set of trenches have been formed, said layer having a thickness which fills the narrower set of trenches but does not fill the wide set of trenches.

3. A method according to claim 2, wherein the second set of trenches is wider than the first set, and wherein the deposited layer serves as the deposited barrier material at the base of the first set of trenches to cover an exposed surface of the sacrificial layer.

4. A method according to claim 2, wherein the first set of trenches is wider than the second set and wherein the deposited layer is a non-oxidizing layer which coats the sidewalls of the first set of trenches and wherein the step of depositing a barrier material at the base of the first set of trenches involves oxidizing the bases thereof, and the method further comprises the step of:
    removing the deposited layer from the second set of trenches before the step of etching through the base thereof.

5. A method according to claim 1, further comprising the step of:
    filling the first set of trenches with an insulating material after the sacrificial layer is etched away so as to provide a semiconductor-on-nothing structure.

6. A method according to claim 5 further comprising the steps of:
    processing one or more of semiconductor devices and circuitry on the semiconductor layer; and,
    detaching the semiconductor layer from the substrate by breaking the support structure.

7. A method according to claim 6, wherein the support structure is broken by bathing the semiconductor layer and substrate in an etch solution.

8. A method according to claim 6, wherein the support structure is broken by applying a pressurized water or air flow thereto.

9. A method according to claim 6, further comprising the steps of:
    depositing a mask layer over the processed semiconductor layer;
    patterning the mask layer to expose selected parts of the semiconductor layer surface;
    dry etching through the exposed parts to divide the processed semiconductor layer into a plurality of discrete islands, each being supported by respective parts of the support structure;
    before the step of detaching the semiconductor layer.

10. A method according to claim 9, wherein the exposed parts have a dimension of less than 1 μm.

11. A method according to claim 6, wherein the substrate is re-used to repeat the method after the semiconductor layer is detached.

* * * * *